(12) United States Patent
Lee et al.

(10) Patent No.: US 6,335,952 B1
(45) Date of Patent: *Jan. 1, 2002

(54) SINGLE CHIP CMOS TRANSMITTER/RECEIVER

(75) Inventors: Kyeongho Lee; Deog-Kyoon Jeong, both of Seoul (KR)

(73) Assignee: GCT Semiconductor, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/121,601

(22) Filed: Jul. 24, 1998

(51) Int. Cl.[7] .................................................. H03D 3/18
(52) U.S. Cl. ........................ 375/327; 375/219; 375/215
(58) Field of Search ................................. 375/215, 280, 375/294, 331, 332, 327, 376, 373; 329/307, 325, 360; 327/156, 147; 455/260, 180.3; 331/1

(56) References Cited

U.S. PATENT DOCUMENTS

| | | | | | |
|---|---|---|---|---|---|
| 5,175,729 A | * | 12/1992 | Borras et al. | .................. | 370/345 |
| 5,408,201 A | * | 4/1995 | Uriya | ................................ | 331/2 |
| 5,418,815 A | * | 5/1995 | Ishikawa et al. | ............. | 375/216 |
| 5,438,591 A | * | 8/1995 | Oie et al. | ...................... | 375/261 |
| 5,507,025 A | * | 4/1996 | Rodeffer | ........................ | 455/266 |
| 5,555,182 A | * | 9/1996 | Galm | .............................. | 702/69 |
| 5,584,062 A | * | 12/1996 | Meador et al. | ................ | 455/260 |
| 5,614,868 A | * | 3/1997 | Nielson | .......................... | 331/1 A |
| 5,734,970 A | * | 3/1998 | Saito | ............................... | 455/76 |
| 5,761,617 A | * | 6/1998 | Yonekura et al. | ............ | 455/343 |
| 5,794,119 A | * | 8/1998 | Evans et al. | ................... | 455/71 |
| 5,861,773 A | * | 1/1999 | Meyer | ........................... | 329/304 |
| 5,872,810 A | * | 2/1999 | Phillips et al. | ............... | 375/222 |
| 5,894,592 A | * | 4/1999 | Brueske et al. | ................ | 455/86 |
| 5,950,119 A | * | 9/1999 | McGeehan et al. | .......... | 455/302 |
| 6,084,905 A | * | 7/2000 | Ishifuji et al. | ................ | 375/202 |
| 6,097,768 A | * | 8/2000 | Janesch et al. | ............... | 375/330 |

* cited by examiner

*Primary Examiner*—Chi Pham
*Assistant Examiner*—Emmanuel Bayard
(74) *Attorney, Agent, or Firm*—Fleshner & Kim, LLP

(57) ABSTRACT

A single chip RF communication system and method is provided including a transmitter and a receiver. The RF communication system in accordance with the present invention includes an antenna for receiving transmitting RF signals, a PLL for generating multi-phase clock signals having a frequency different from a carrier frequency in response to the multi-phase clock signals and a reference signal having the carrier frequency, a demodulation-mixing unit for mixing the received RF signals with the multi-phase clock signals having the frequency different from the carrier frequency to output the RF signals having a frequency reduced by the carrier frequency and an A/D converting unit for converting the RF signals from the mixing unit into digital signals.

32 Claims, 15 Drawing Sheets

SINGLE CHIP CMOS TRANSMITTER/RECEIVER

BACKGROUND OF THE INVENTION

1. Field of the Invention

The present invention relates to a communication system, and in particular, to a CMOS radio frequency (RF) communication system.

2. Background of the Related Art

Presently, a radio frequency (RF) communications system has a variety of applications including PCS communication and IMT systems. As such, a CMOS chip ntegration of the system has been pursued to reduce the cost, size and power consumption.

Generally, the RF communication system is composed of RF front-end block and base-band digital signal processing PSP) block. Currently, the base-band DSP block can be implemented with low cost and low power CMOS technology. However, the RF front-end cannot be implemented by CMOS technology because of limitations in speed and noise characteristics, which are below the speed and noise specification of popular RF communication systems.

For example, the PCS hand-phone systems operate at a frequency over 2.0 GHz, but current CMOS technology reliably operates only up to approximately 1.0 GHz in terms of speed and noise. Hence, the RF front-end block is implemented using bipolar or bi-CMOS technology that has better speed and noise characteristics than CMOS technology but is more expensive and consumes more power.

Currently, two different types of RF architecture called "direct conversion" and "double conversion" are used for CMOS RF communication systems. Both architectures have advantages and disadvantages in terms of CMOS implementations.

FIG. 1 is a diagram showing a related art direct conversion RF system 100. The related art direct conversion CMOS RF communication system 100 includes an antenna 105, a RF filter 110, a low noise amplifier (LNA) 120, a first mixer 140, a second mixer 145, a phase-locked loop (PLL) 130, a first low pass filter (LPF) 150, a second LPF 155, a first analog/digital (A/D) converter 160, a second A/D converter 165, a third mixer 160 and a power amplifier 170.

The antenna 105 receives RF signals and selected RF signals are then filtered at the RF filter 110. The filtered RF signals are amplified with a gain at the LNA 120 and the RF signals passing through the LNA 120 are directly demodulated into base band signals by quadrature multiplication at the first and second mixers 140 and 145. The PLL 130 preferably generates two types of clock signals, I signals and Q signals using a voltage controlled oscillator (VCO). The I clock signals and the Q clock signals are the same excepting a phase difference. I signals preferably have a phase difference of 90 degrees from Q signals. That is, Q signals are phase shifted with respect to quadrature phase shift I signals. The two sets of signals I and Q are preferably used to increase the ability of the RF system to identify or maintain received information regardless of noise and interference. Sending two types of signals having different phases reduces the probability of information loss or change. A demodulation frequency $f_0$ in FIG. 1 is equal to a modulation frequency $f_0$.

As shown in FIG. 1, the demodulated based band signals have a frequency reduced by the frequency $f_0$ from an original frequency to pass through the first and second LPF 150 and 155 and eventually become respective signals required for A/D conversion at the first and second A/D converters 160 and 165. The digital signals are then transferred to a base-band discrete-time signal processing (DSP) block (not shown). Channel selection is performed by changing frequency $f_0$ in at the phase-locked loop (PLL) 130.

As described above, the related art direct conversion RF system 100 has advantages for CMOS RF integration because of its simplicity. In the related at direct conversion RF system only a single PLL is required. Further, in the related art direct conversion RF system high-quality filters are not required. However, related art the direct conversion architecture has disadvantages that make single chip integration difficult or impossible. As shown in FIG. 2A, clock signals cos $\omega_{LO}t$ from a local oscillator (LO) such as the VCO may leak to either the mixer input or to the antenna where radiations may occur because the local oscillator (LO) is at the same frequency as the RF carriers. The unintentionally transmitted clock signals $\Delta(t)\cos \omega_{LO}t$ signals can reflect off nearby objects and be "re-received" by the mixer again. The low pass filter outputs a signal $M(t)+\Delta(t)$ because of leakages of clock signals. As shown in FIG. 2B, self-mixing with the local oscillator results in problems such as time variations or "wandering" DC-offsets at the output of the mixer.

FIG. 2B illustrates time variations and a DC-offset. A denotes a signal before the mixer and B denotes a signal after the mixer. The time-varying DC-offset together with inherent circuit offsets significantly reduce the dynamic range of the receiver portion. In addition, a direct conversion RF system requires a high-frequency, low-phase-noise PLL for channel selection, which is difficult to achieve with an integrated CMOS voltage controlled oscillator (VCO).

FIG. 3 shows a block diagram of a related art RF communication system 300 according to an double conversion architecture that considers all of the potential channels and frequency transistors. As shown in FIG. 3, the RF communication system 300 includes antenna 305, a RF filter 310, a LNA 320, a first mixer 340, a second mixer 345, a first LPF 350, a second LPF 355, second stage mixers 370–373, a first adder 374, a second adder 375. The RF communication system 300 further includes a third LPF 380, a fourth LPF 385, a first A/D converter 390, a second A/D converter 395, first and second PLLs 330 and 335, a third mixer 360 and a power amplifier 370.

The mixers 340, 345 and 370–373 are all for demodulation while the third mixer 360 is for modulation. The first and second mixers 340 and 345 are for a selected RF frequency and the mixers 370–373 are for an intermediate frequency (IF). The first PLL 330 generates clock signals at a high frequency or the RF frequency, the second PLL 335 generates clock signals having a low frequency or the intermediate frequency (IF).

Transmission data are multiplied with the clock signals having the RF frequency from the PLL 330 to have a frequency reduced by the RF frequency from an original transmission data frequency. The output signals of the third mixer 360 are amplified with a gain at the power amplifier 370 and then radiated through the antenna 305 for transmission.

For reception data the antenna 305 receives RF signals and the RF filter 310 filters the RF signals. The filtered RF signals are amplified by the LNA 320 and are converted into IF signals by the quadrature mixers 340, 345 with a single frequency local oscillator, generally a VCO. The PLL 330 generates clock signals for I signals of the RF signals and generates clock signals for Q signals of the RF signals. The mixer 340 multiplies the RF signals with the clock signals for the I signals having the RF frequency and the mixer 345 multiplies the RF signals with the Q signals having the RF frequency. The LPFs 350, 355 are used at an IF stage (i.e., first stage) to remove any frequency components not converted upon conversion to the IF signals, which allows all channels to pass to the second stage mixers 370–373. All of the channels at the IF stage are then frequency-translated directly to base-band frequency signals by the tunable PLL 335 for channel selection.

Demodulated base band signals C pass low pass filters (LPF) 380 and 385 and are converted into digital data by A/D converters 390 and 395. The digital data is then transferred into a base-band discrete-time signal processing (DSP) block (not shown).

As described above, the related art double conversion RF system 300 has various advantages. The related art double conversion RF system 300 performs the channel tuning using the lower-frequency, i.e., IF, second PLL 335, but not the high-frequency, i.e., RF, first PLL 330. Consequently, the high-frequency RF PLL 330 can be a fixed-frequency PLL that can be more effectively optimized. Further, since channel tuning is performed with the IF PLL 335, which operates at a lower frequency, the contribution of phase noise into channel selection can be reduced. However, the related art double conversion RF system 300 has various disadvantages to overcome for single chip integration. The related art double conversion RF system 300 uses two PLLs, which are difficult to integrate in a single chip. Further, the frequency of first PLL remains too high to be implemented with CMOS technology, and in particular, with a CMOS VCO. In addition, self-mixing problem still occurs because the second PLL is at the same frequency of the IF desired carrier. FIG. 4A is a diagram showing leakage of clock signals in the RF communication system 300. FIG. 4B is a diagram showing time variation and "wandering" DC-offset because of leaking clock signals $\Delta(t)\cos \omega_{LO2}(t)$ (e.g., self-mixing) in the RF communication system 300 of FIG. 3.

In FIG. 4B, the first mixer multiplies the RF signals with clock signals $\cos \omega_{LO1} t$ for RF having a frequency $\omega_{LO1}$ and outputs the RF signals with $M(t)\cos \omega_{LO2} t$ having a frequency reduced by the frequency $\omega_{LO1}$. The second mixer multiples the RF signals from the first mixer with clock signals $\cos \omega_{LO2}$ for IF having a frequency $\omega_{LO2}$. However, since the frequency of the output signals of the second mixer is same as the frequency of desired RF carriers before the LPFs. Thus, the output signals of the second mixer may leak to a substrate or may leak to the second mixer again. The time-varying DC-offset, together with inherent circuit offsets significantly reduces the dynamic range of the receiver portion.

SUMMARY OF THE INVENTION

An object of the present invention is to at least substantially obviate problems and disadvantages of the related art.

A further object of the present invention is to fabricate a CMOS RF front end and method for using same that allows one chip integration of an RF communication system.

Another object of the present invention is to provide an RF communication system and method with reduced cost and power requirements.

Still another object of the present invention is to provide a reliable high speed, low noise CMOS RF communication system and method for using same.

Another object of the present invention is to increase a frequency range of a RF front end of an RF communication system.

To achieve at least the above objects and advantages in a whole or in parts and in accordance with the purpose of the present invention, as embodied and broadly described, the structure of the invention includes an antenna for receiving transmitting RF signals, a PLL for generating multi-phase clock signals having a frequency different from a carrier frequency in response to the multi-phase clock signals and a reference signal having the carrier frequency; a demodulation-mixing unit for mixing the received RF signals with the multi-phase clock signals having the frequency different from the carrier frequency to output the RF signals having a frequency reduced by the carrier frequency, and a A/D converting unit for converting the RF signals from the mixing unit into digital signals.

To further achieve the objects in a whole or in parts, in accordance with the purpose of the present invention a method of operating a RF communication system includes an antenna for receiving and transmitting RF signals, a PLL for generating 2N-phase clock signals having a frequency $2*f_0/N$ smaller than a carrier frequency $f_0$, wherein N is a positive integer as a phase number, a demodulation mixing unit for mixing the RF signals from the antenna with 2N-phase clock signals from the PLL to output the RF signals having a frequency reduced by the carrier frequency and comprising a plurality of two input mixers, and a A/D converting unit for converting the RF signals from the demodulation mixing unit into digital signals.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

A single chip radio frequency (RF) communication system formed using CMOS techniques has various requirements. A CMOS voltage controlled oscillator (VCO) has poor noise characteristics. Accordingly, a CMOS phase-locked loop (PLL) integration is required. However, the number of PLL should be small and the center frequency of a PLL preferably differs sufficiently from a transmitting RF frequency (e.g., preferably low enough) to control a phase noise result using the CMOS VCO. High-quality filters are preferably eliminated because of associated disadvantageous area and power specifications. Also, a number of components in the CMOS RF system should be small or reduced without performance degradation.

Figure 5:
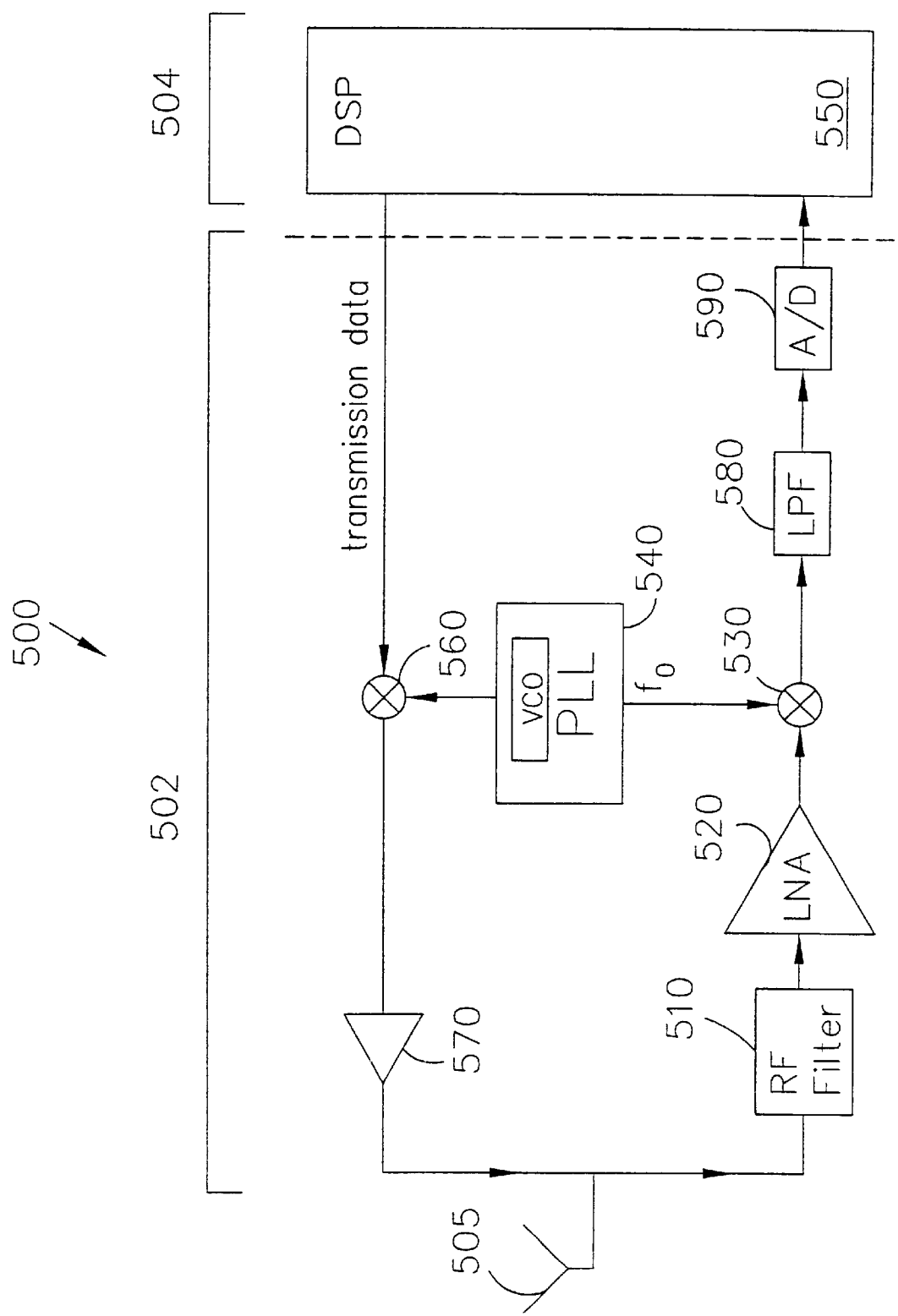
FIG. 5 is a diagram showing a first preferred embodiment of a multi-phase, low frequency (MPLF) RF communication system according to the present invention.

A first preferred embodiment of a "multi-phase, low frequency" (MPLF) conversion RF communication system 500 is shown in FIG. 5 and can preferably be formed on a single CMOS chip. The first preferred embodiment can operate at frequencies well above 1 GHz. The phrase "multi-phase low frequency conversion" is used because a single-phase periodic signal having a high frequency is preferably obtained by multiplying multi-phase low-frequency periodic signals together. The first preferred embodiment of the MPLF conversion RF communication system 500 includes a front-end MPLF RF block 502 and a digital signal processing (DSP) block 504, which is preferably base-band. As discussed above, related art DSP blocks can be formed of CMOS techniques. Accordingly, a detailed explanation of the DSP block 502 including a digital signal processor 550 will be omitted.

The MPLF conversion RF block 502 includes an antenna 505, an RF filter 510 (e.g., band pass filter), low noise amplifier (LNA) 520 and first and second mixers 530 and 560, respectively. The MPLF conversion RF block 502 further includes a phase-locked loop (PLL) 540, a low pass filter (LPF) 580, an analog/digital (A/D) converter 590 and a power amplifier 570 coupled between the second mixer 560 and the antenna 505. The PLL 540 generates a modulating and de-modulating clock, i.e., local oscillator(LO), whose frequency is determined by a reference clock (REF $f_0$).

Figure 6:
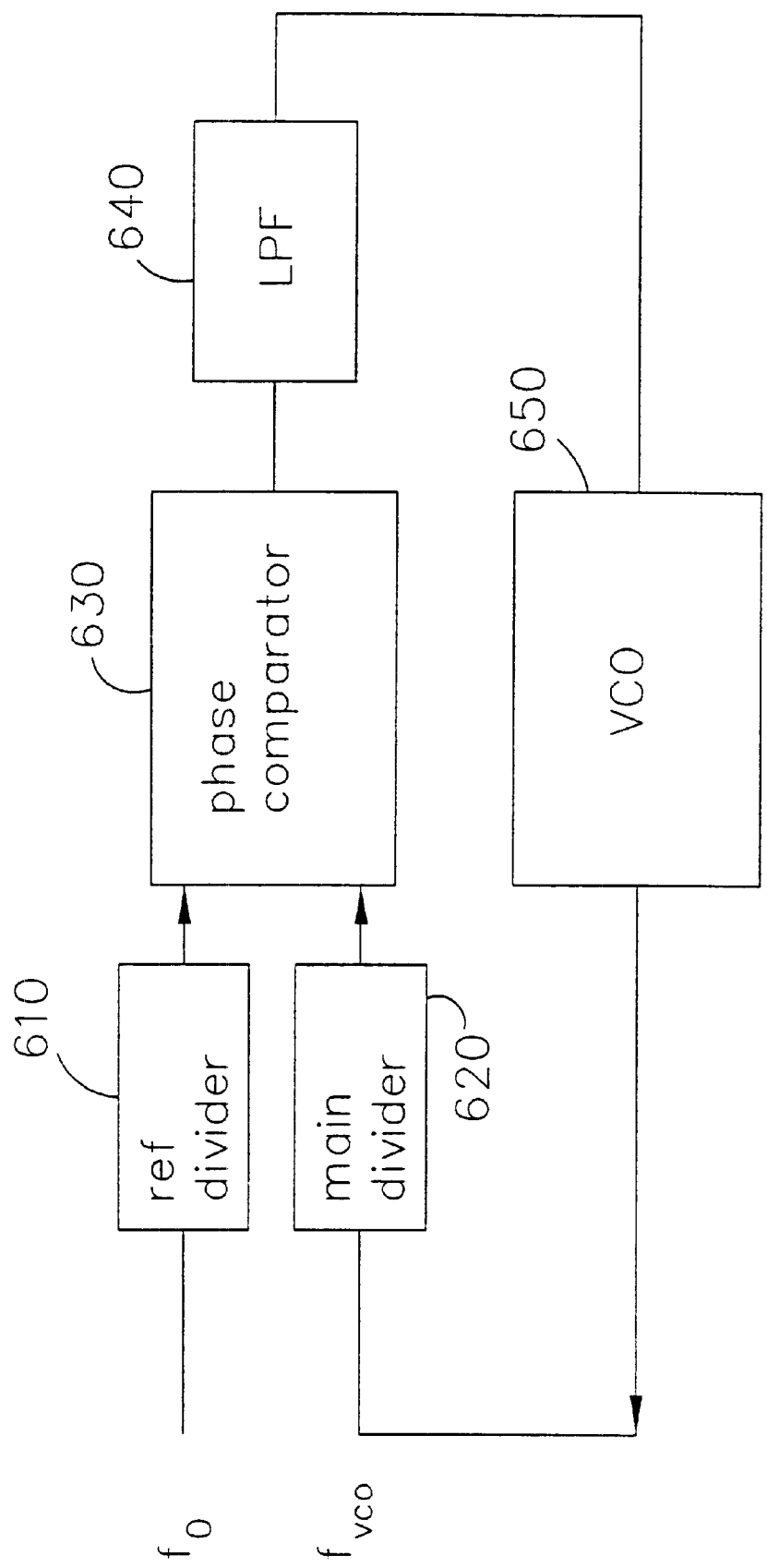
FIG. 6 is a block diagram showing an exemplary PLL circuit.

FIG. 6 shows a block diagram of an exemplary embodiment of the PLL 540. As shown in FIG. 6, the PLL 540 includes reference and main dividers 610, 620, respectively, phase comparator 630, loop filter 640 and a voltage controlled oscillator (VCO) 650. The VCO 650 outputs the LO frequency $f_0$, which is compared to the reference clock signal by the phase comparator 630. An output signal of the phase to comparator 630 is passed though the loop filter 640 as a control signal (e.g., frequency) for the VCO 650. The frequency of the LO is preferably varied according to the communication system. For example, the LO frequency for a personal communication system (PCS) can be 1.8 GHz, and the LO frequency for the IMT 2000 system is 2.0 GHz.

In the first preferred embodiment of the MPLF conversion RF communication system 500, transmission data is received by the MPLF RF block 502 from the DSP block 504. The transmission data is modulated by a preferably modulating second mixer 560 at the LO frequency. The modulated data is amplified by the power amplifier 570 and is then output by the antenna 505.

The low noise amplifier (LNA) 520 receives an input signal from the antenna 505 and amplifies the signal level to output an RF signal. The RF BPF 520 is preferably coupled between the antenna 505 and the LNA 520. The RF signal is de-modulated by the de-modulating first mixer 530 at preferably the same frequency as the modulation frequency. The output of the de-modulating mixer 530 becomes received data by passing the LPF 580. The received data is preferably converted to a digital signal by the A/D converter 590 and output to the DSP 550.

In order to use a single PLL with a center frequency sufficiently lower than a transmitting RF frequency, the first preferred embodiment of the MPLF conversion RF communication system 500 uses a single-phase high-frequency periodic signal (i.e., RF frequency) obtained by multiplying a multi-phase low-frequency periodic signal together. In particular, a high frequency "sine" and "cosine" signal is needed in a RF system, although the present invention is not intended to be so limited. Sine and cosine signals, which have frequencies of $W_{RF}$, can be obtained by multiplying N-phase sine signals that have frequencies of $2\omega_{RF}/N$ as shown in equations 1 and 2 as follows.

$$\cos\omega_{RF} = 2^{\frac{N}{2}-1} \prod_{k=0}^{\frac{N}{2}-1} \sin\left(\frac{2\cdot\omega_{RF}}{N}\cdot t - \frac{2\cdot k\cdot\pi}{N} + \frac{\pi}{N}\right) \quad (1)$$

$$\sin\omega_{RF} = 2^{\frac{N}{2}-1} \prod_{k=0}^{\frac{N}{2}-1} \sin\left(\frac{2\cdot\omega_{RF}}{N}\cdot t - \frac{2\cdot k\cdot\pi}{N}\right) \quad (2)$$

A multiplication factor is not "N" but "N/2" because the remaining N/2 sine signals can be an inverted version of the first N/2 sine signals. The inverted signals are preferably used to make differential signals for a differential input mixer.

Figure 7:
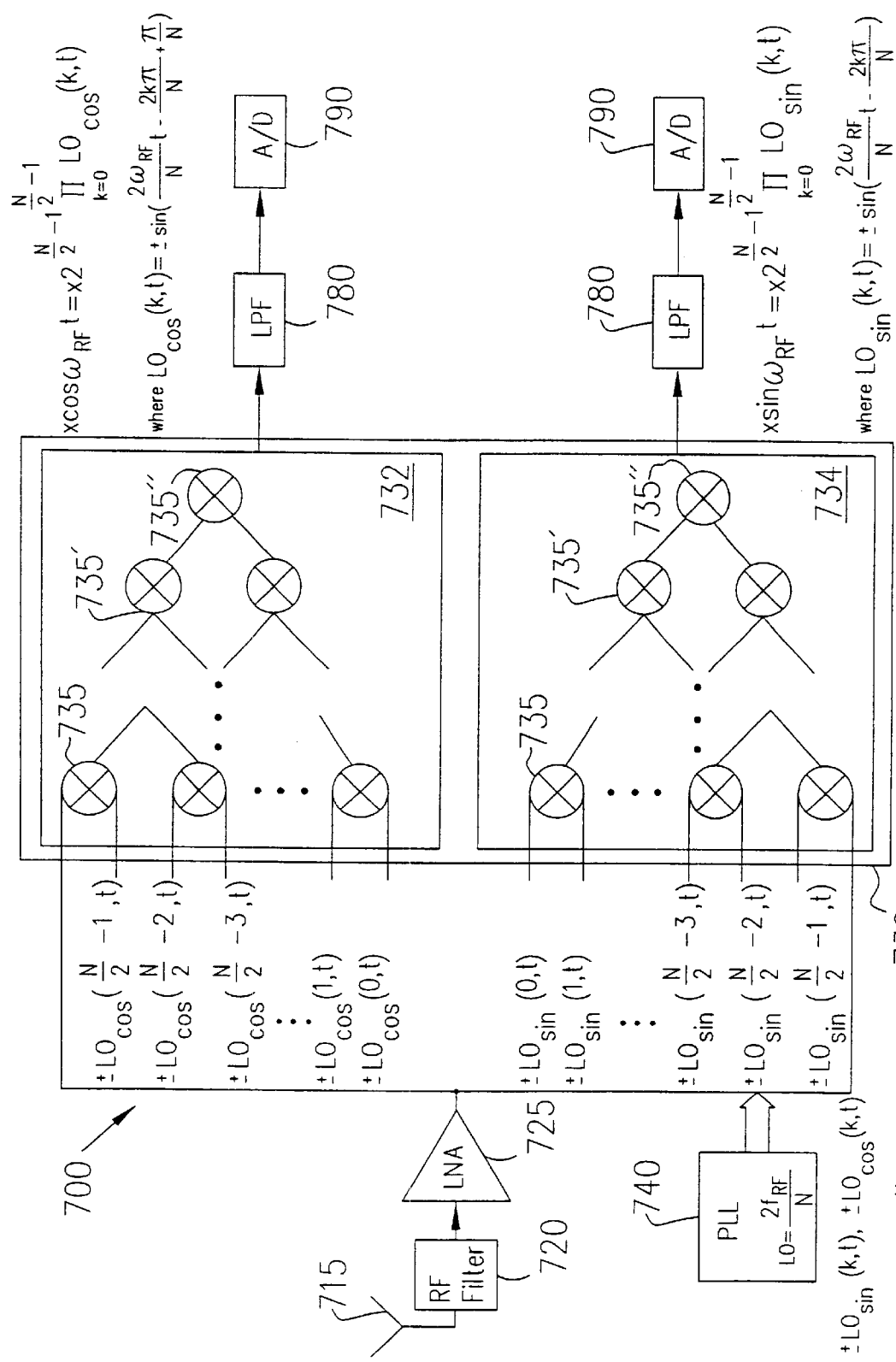
FIG. 7 is a block diagram showing a receive portion of a RF communication system according to another preferred embodiment of the present invention.

FIG. 7 shows a receive portion 700 of a second preferred embodiment of a RF block according to the present invention. The second preferred embodiment of the receive portion 700 can be used in the first preferred embodiment of the MPLF conversion RF communication system. As shown in FIG. 7, the receive portion 700 includes an antenna 715, an RF filter 720, LNA 725 and demodulation mixer 730. The receive portion 700 of the RF block further includes a PLL 740, a low pass filter 780 and a analog/digital converter 790. The PLL 740 generates a de-modulating clock, i.e., local oscillator (LO) equal to $2*f_0/N$, whose frequency is determined by a reference clock (not shown). The antenna 715, the RF filter 720, the LNA 725, the LPF 780 and the analog/digital converter 790 operate similar to the first preferred embodiment, and accordingly, a detailed explanation is omitted.

The receive portion 700 of the RF block uses just one PLL. The PLL 740 uses a frequency of $2*f_0/N$. The PLL 740 generates in total 2N-phase clock signals. The PLL 740 generates N-phase±LO$_{cos}$(k,t) and N-phase±LO$_{sin}$(k,t) signals, which are preferably determined as shown in equations 3–4.

$$\pm LO_{cos}(k, t) = \pm \sin\left(\frac{2\omega_{RF}}{N}t - \frac{2k\pi}{N} + \frac{\pi}{N}\right) \quad (3)$$

where, $k = 0, 1, 2 \ldots \frac{N}{2} - 1$ $$\pm LO_{sin}(k, t) = \pm \sin\left(\frac{2\omega_{RF}}{N}t - \frac{2k\pi}{N}\right) \quad (4)$$

where, $k = 0, 1, 2 \ldots \frac{N}{2} - 1$

Figure 1:
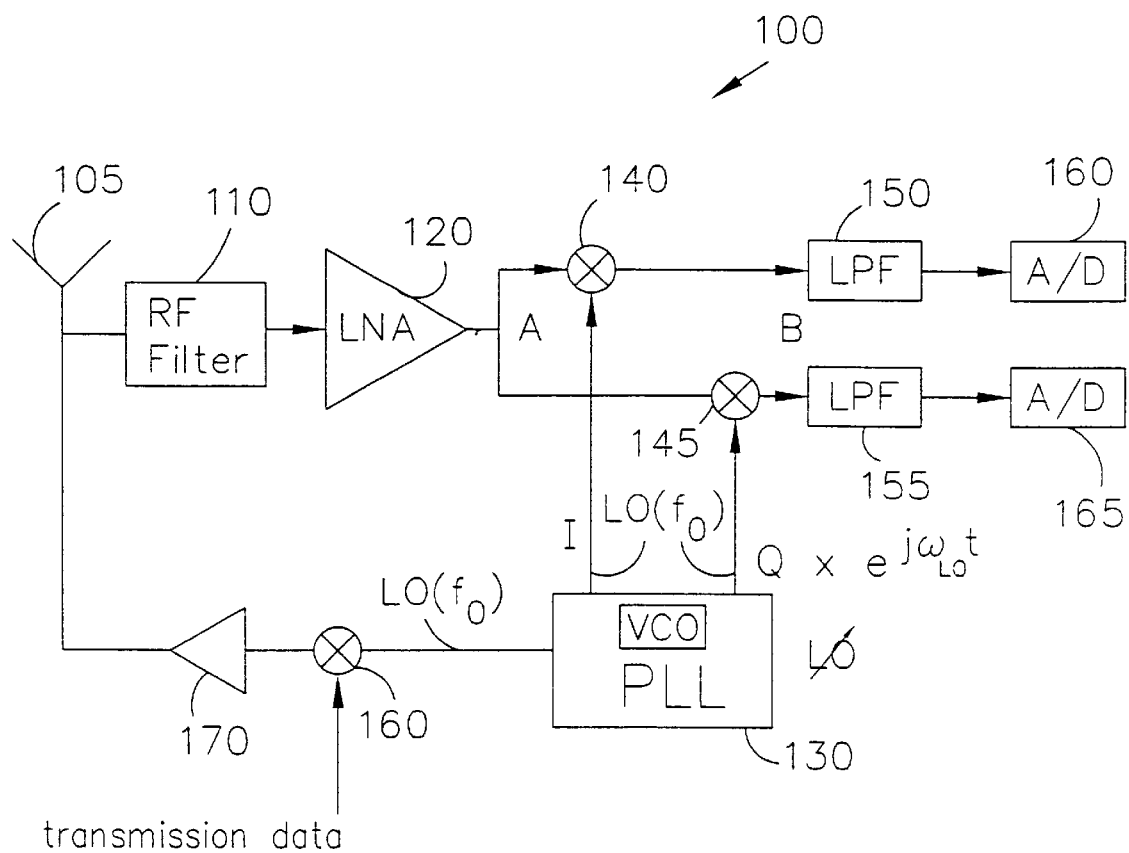
FIG. 1 is a circuit diagram showing a related art RF communication system.
Figure 2A:
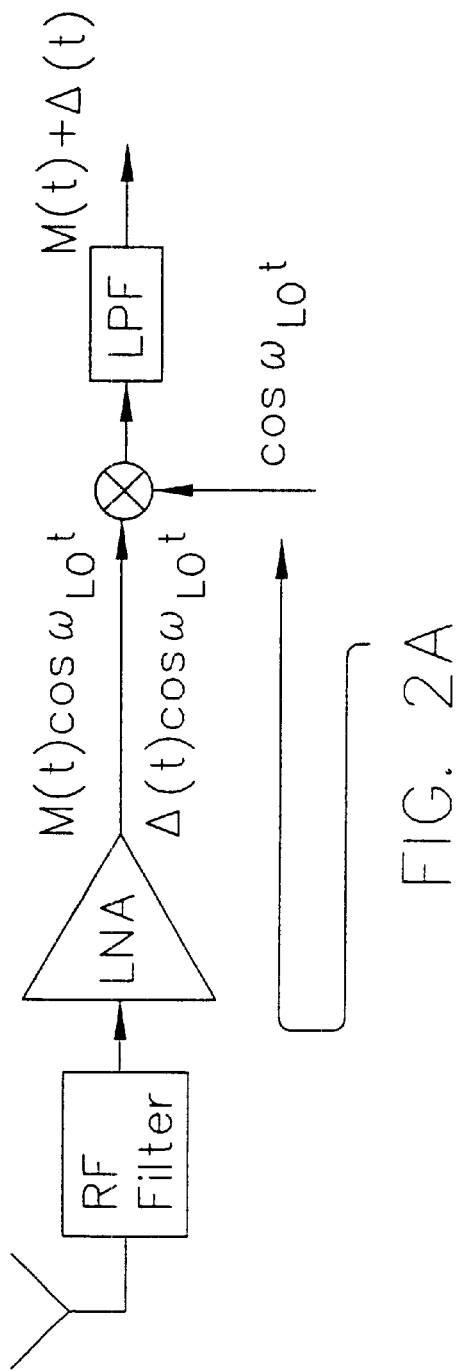
FIG. 2A is a diagram showing clock signal leakage in the circuit of FIG. 1.
Figure 2B:
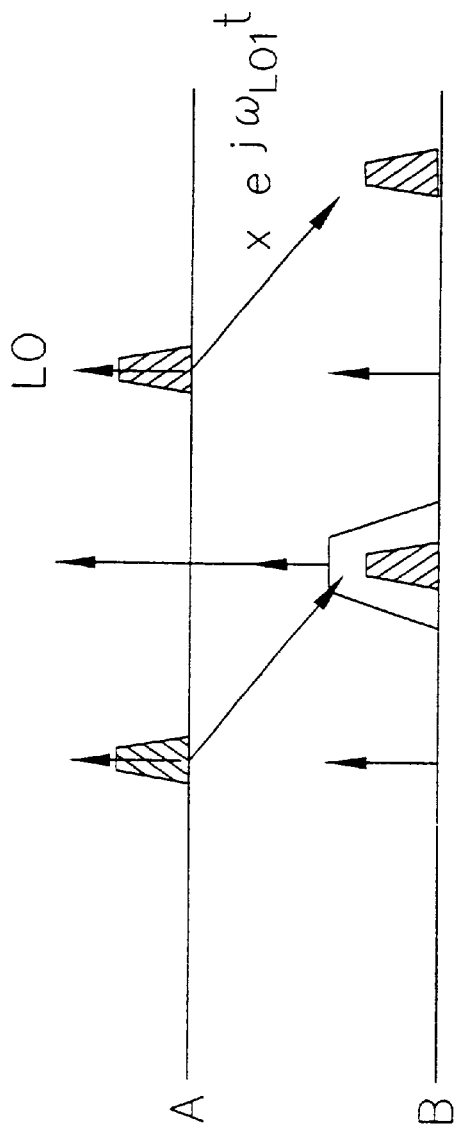
FIG. 2B is a diagram showing "self mixing" in the circuit of FIG. 2A.
Figure 3:
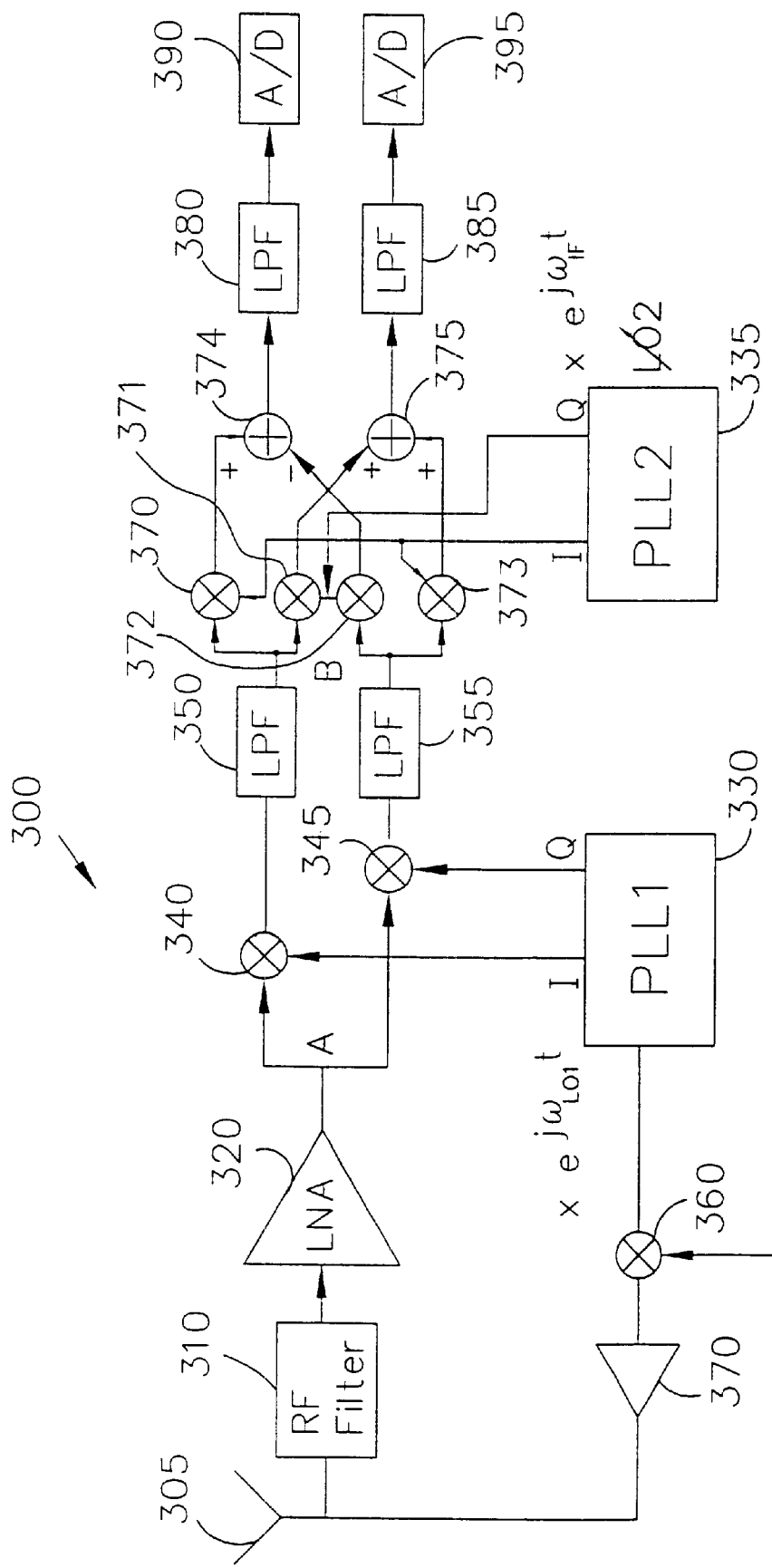
FIG. 3 is a circuit diagram showing another related art RF communication system.
Figure 4A:
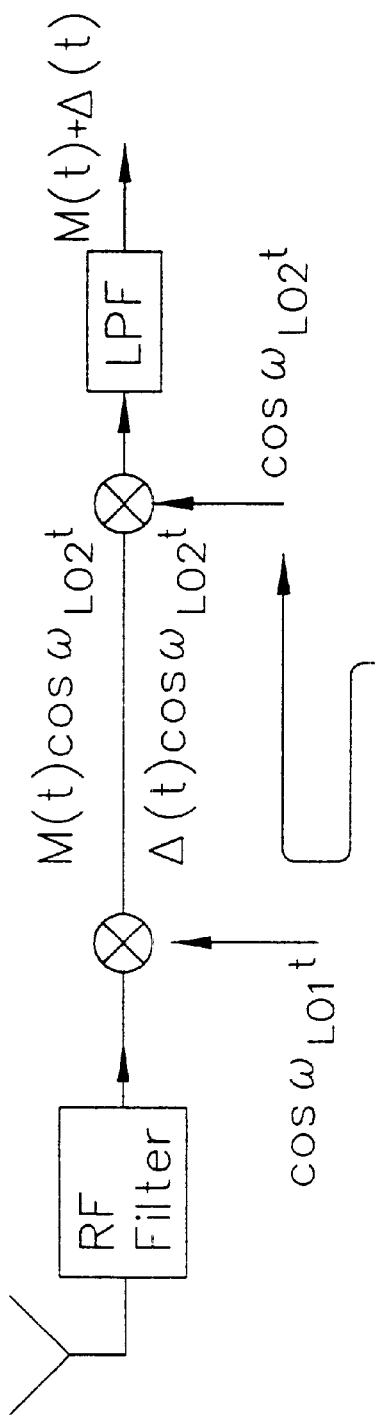
FIG. 4A is a diagram showing clock signal leakage in the circuit of FIG. 3.
Figure 4B:
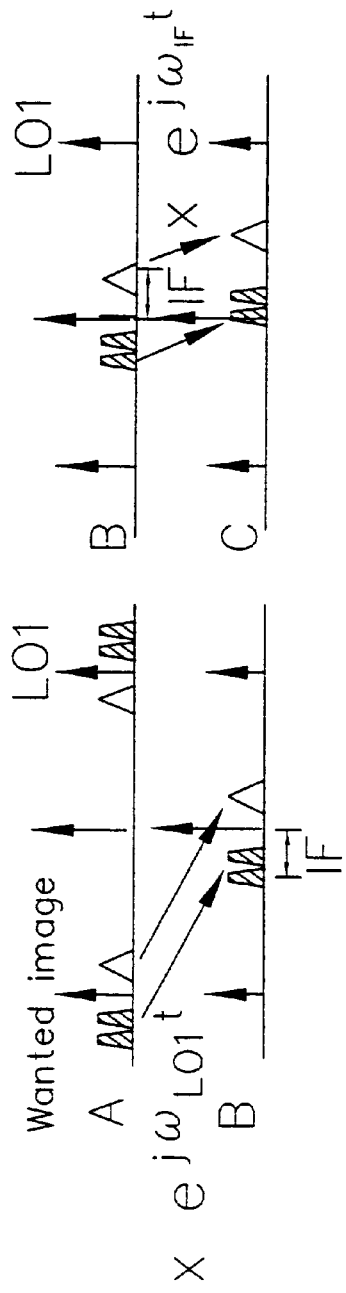
FIG. 4B is a diagram showing "self mixing" in the circuit of FIG. 4A.

As shown in FIG. 7, the receive portion 700 of the RF block has the demodulating mixer 730 divided into upper and lower mixer arrays 732 and 734. Each of the upper and lower mixer arrays 732 and 734 includes a plurality of conventional 2-input mixers 735. The upper mixer array 732 multiplies N-phase (N/2: un-inverted, N/2: inverted) with a frequency of (2$\omega_{RF}$)/N, sine signals and a RF signal, which is equivalent to multiplying single phase, frequency of $\omega_{RF}$, cosine signals and the RF signal. Both un-inverted and inverted sine signals are needed for inputting to a single mixer because the conventional 2-input mixer requires differential input. The lower mixer array 734 multiplies N-phase (N/2: un-inverted, N/2 inverted) with a frequency of $\omega_{RF}$/N, sine signals and the RF signal, which is equivalent to multiplying single phase, frequency of $\omega_{RF}$ sine signals and the RF signal. Thus, the receive portion 700 of the RF block functions equivalently with the direct conversion architecture shown in FIG. 1. However, the receive portion 700 according to the present invention uses the N-phase, frequency of 2$\omega_{RF}$/N, sine signals in de-modulation in contrast to the single phase, frequency of $\omega_{RF}$ sine signal.

As described above, the PLL 740 generates 2N-phase clock signals. N-phase clock signals are N-phase sine signals and N-phase clock signals are N-phase cosine signals. Both the N-phase signals includes N/2 non-inverted signals and N/2 inverted signals. The N-phase sine signals are input to the upper mixer array 732 together with the RF signals and the N-phase sine signals are input to the lower mixer array 734, together with the RF signals. The upper and lower mixer arrays 732 and 734 have a plurality of mixers 735 and a M number of stages respectively. The M number of stages includes a first stage, (e.g., 735), a second stage (e.g., 735'), ..., a M-1th stage, and a Mth stage (e.g., 735"). Each stage of each mixer array includes at least one mixer having two inputs. The number K1 of mixer at the first stage is the highest number of stages. The last stage, the Mth stage has the lowest number (KM) of mixers among the whole stages. The relative order of the mixer-number among the stages may be expressed the inequality K1)K2)K3)K4 ... KM-1)KM.

Each mixer 735 has two inputs. Each input has an inverted signal and a non-inverted signal of the inverted signal because each input of the mixers 735 inputs two different signals. As described above, the RF signals from the LNA 725 and the N-signals from the PLL 746 are used as the input signals of mixers 735 at a first stage. Output signals of mixers 735 at the first stage are used as input signals of mixers 735' at the second stage. In a same manner, output signals of mixers at the M-1th stage are used as two input signals of a mixer 735", which is a single mixer at the Mth stage of the upper mixer array 732 and the lower mixer array 734.

Figure 8:
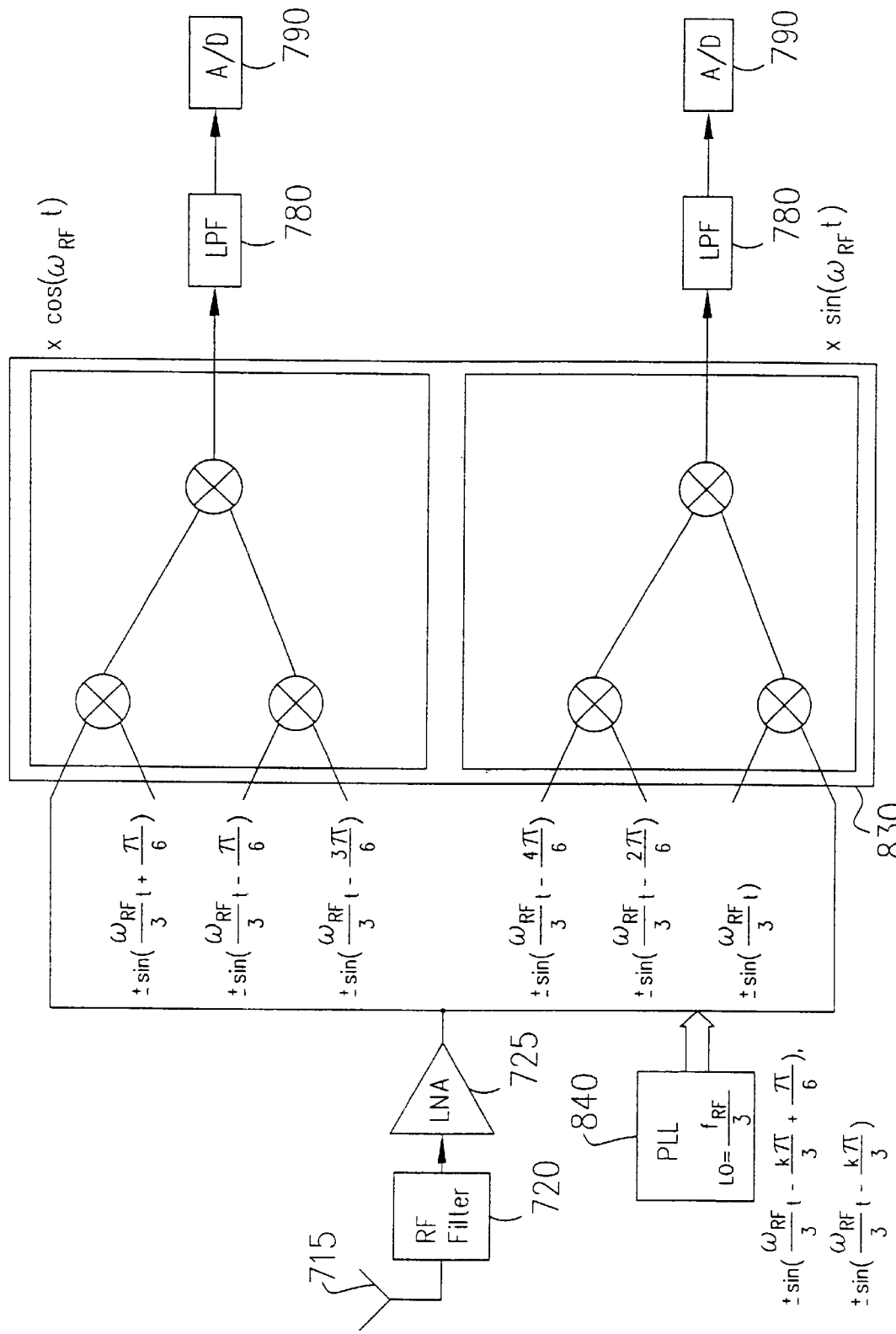
FIG. 8 is a block diagram showing the RF communication system of FIG. 7 with six phases.

FIG. 8 shows a 6-phase example for the receive portion 700 of an MPLF conversion RF communication system that uses the conventional 2-input mixer. As shown in FIG. 8, a PLL 840 generates 12-phase sine signals, which are transmitted to a mixer 830. The phase difference between adjacent two signals is π/6 (i.e.,2π/12). Phases (0,2,4,6,8,10) are used as inputs to an upper mixer 832 and multiplied together with the preferably RF input, which is equivalent with multiplying cos ($\omega_{RF}$t) and the RF input. Phases (1,3,5,7,9, 11) are input to a lower mixer 834 and multiplied together with the preferably RF input, which is equivalent with multiplying sin ($\omega_{RF}$t) and the RF input. Accordingly, the frequency of the clock signals is $f_0$ when the clock signals are multiplied with the RF signals.

The PLL 840 includes a clock generator such as a voltage controlled source (VCO) and thus generates 12-phase clock signals for the multiplication with the RF signals upon demodulation. The generated clock signals have a frequency 2*$f_0$/P (P=phase number) lower than a frequency $f_0$ to be multiplied with the RF signals. The clock signals from the PLL 840 may have the lower frequency 2*$f_0$/P because the PLL 840 generates multi-phase clock signals phase 0, ..., phase 12. Filtered RF signals are amplified with a gain in the LNA 725 and multiplied with the multi-phase clock signals, 12 sine signals in the mixer array 830 for modulation. The RF signals multiplied with the clock signals have a frequency lower than an original frequency by a final frequency $f_0$ of the clock signals. The initial frequency 2*$f_0$/P of the clock signals from the PLL 840 is changed to the frequency $f_0$ for multiplication with the RF signals in the mixer (e.g., mixer array) 830. Therefore, the upper mixer array 832 and the lower mixer array 834 combine the clock signals having the frequency 2*$f_0$/P and multiply the clock signals having frequency $f_0$ with the RF signals. Consequently, the RF signals having a frequency reduced by frequency $f_0$ pass through the LPFs 780 and the A/D converters 790 and are sent to a DSP part (not shown). The 12 phase sine signals generated by the PLL 840 are shown as follows:

Phase 0:  $\sin\left(\frac{\omega_{RF}}{3}t + \frac{\pi}{6}\right)$

Phase 7:  $-\sin\left(\frac{\omega_{RF}}{3}t\right)$

Phase 9:  $-\sin\left(\frac{\omega_{RF}}{3}t - \frac{2\pi}{6}\right)$

Phase 1:  $\sin\left(\frac{\omega_{Rf}}{3}t\right)$

Phase 10: $-\sin\left(\frac{\omega_{RF}}{3}t - \frac{3\pi}{6}\right)$

Phase 2:  $\sin\left(\frac{\omega_{RF}}{3}t - \frac{\pi}{6}\right)$

Phase 11: $-\sin\left(\frac{\omega_{RF}}{3}t - \frac{4\pi}{6}\right)$

Phase 3:  $\sin\left(\frac{\omega_{RF}}{3}t - \frac{2\pi}{6}\right)$

Phase 4:  $\sin\left(\frac{\omega_{RF}}{3}t - \frac{3\pi}{6}\right)$

Phase 5:  $\sin\left(\frac{\omega_{RF}}{3}t - \frac{4\pi}{6}\right)$

Phase 6:  $-\sin\left(\frac{\omega_{RF}}{3}t + \frac{\pi}{6}\right)$

Phase 8:  $-\sin\left(\frac{\omega_{RF}}{3}t - \frac{\pi}{6}\right)$

Figure 9:
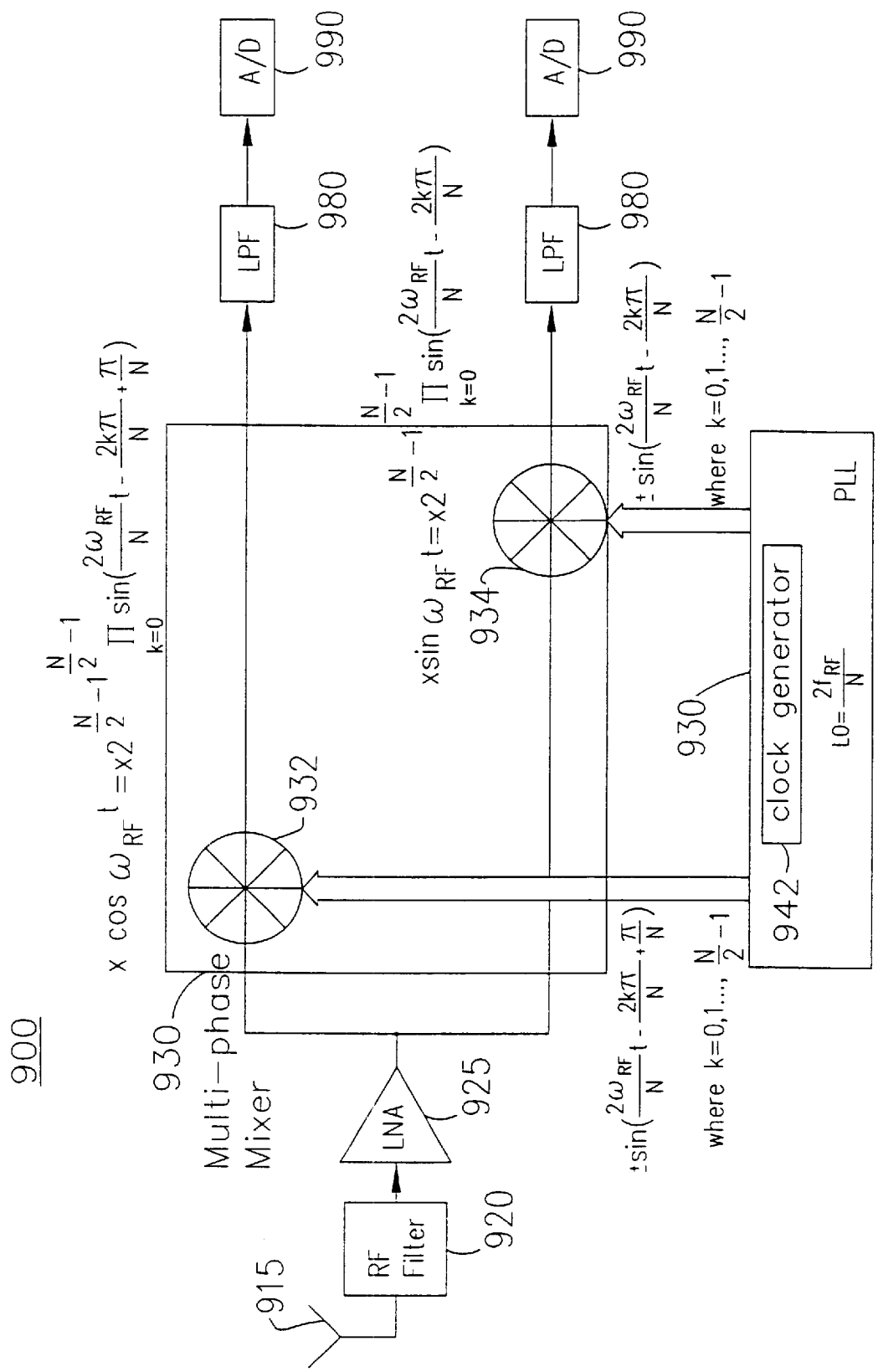
FIG. 9 is a block diagram showing a receive portion of a RF communication system according to yet another preferred embodiment of the present invention.

FIG. 9 shows a MPLF conversion receive portion 900 of an RF block according to a third preferred embodiment of the present invention. The third preferred embodiment of the receive portion 900 can be used in the first preferred embodiment of the MPLF conversion RF communication system. As shown in FIG. 9, the receive portion 900 includes an antenna 915, a RF filter 920, a LNA 925 and mixer 930. The receive portion 900 of the RF block further includes a PLL 940, a LPF 980 and an A/D converter 990. The PLL 940 preferably generates a de-modulating clock, i.e., local oscillator (LO) preferably equal to $2*f_{RF}/N$, whose frequency is determined by a reference clock (not shown). The antenna 915, the RF filter 920, the LNA 925, the LPF 980 and the A/D converter 990 operate similar to the first preferred embodiment, and accordingly, a detailed explanation is omitted.

The receive portion 900 of the RF block uses just one PLL. The PLL 940 includes a clock generator 942 preferably using a frequency of $2*f_{RF}/N$. The clock generator 942 preferably generates N-phase$\pm LO_{cos}(k,t)$ and N-phase$\pm LO_{sin}(k,t)$ signals, which total 2N phase signals. The clock generator 942 is preferably a multi-phase VCO and the mixing section 930 is also a multi-phase mixer.

As shown in FIG. 9, the receive portion 900 of the RF block uses multi-phase mixers 932 and 934. The upper multi-phase mixer 932 replaces the function of the upper mixer array 732 and the lower multi-phase mixer 934 replaces the function of the lower mixer array 734.

The PLL 940 can generate clock signals for modulation and demodulation. The clock generator 942 of the PLL 940 generates clock signals having a frequency $2*f_0/N$ (N=phase number) for demodulation and modulation. The clock generator 942 generates clock signals with frequency $2*f_0/N$ because of frequency limits according to CMOS device implementation. For a CMOS implementation of a RF communication system, a frequency of the clock generator 942 should be different and lower than that of the mixing section 930.

Figure 10:
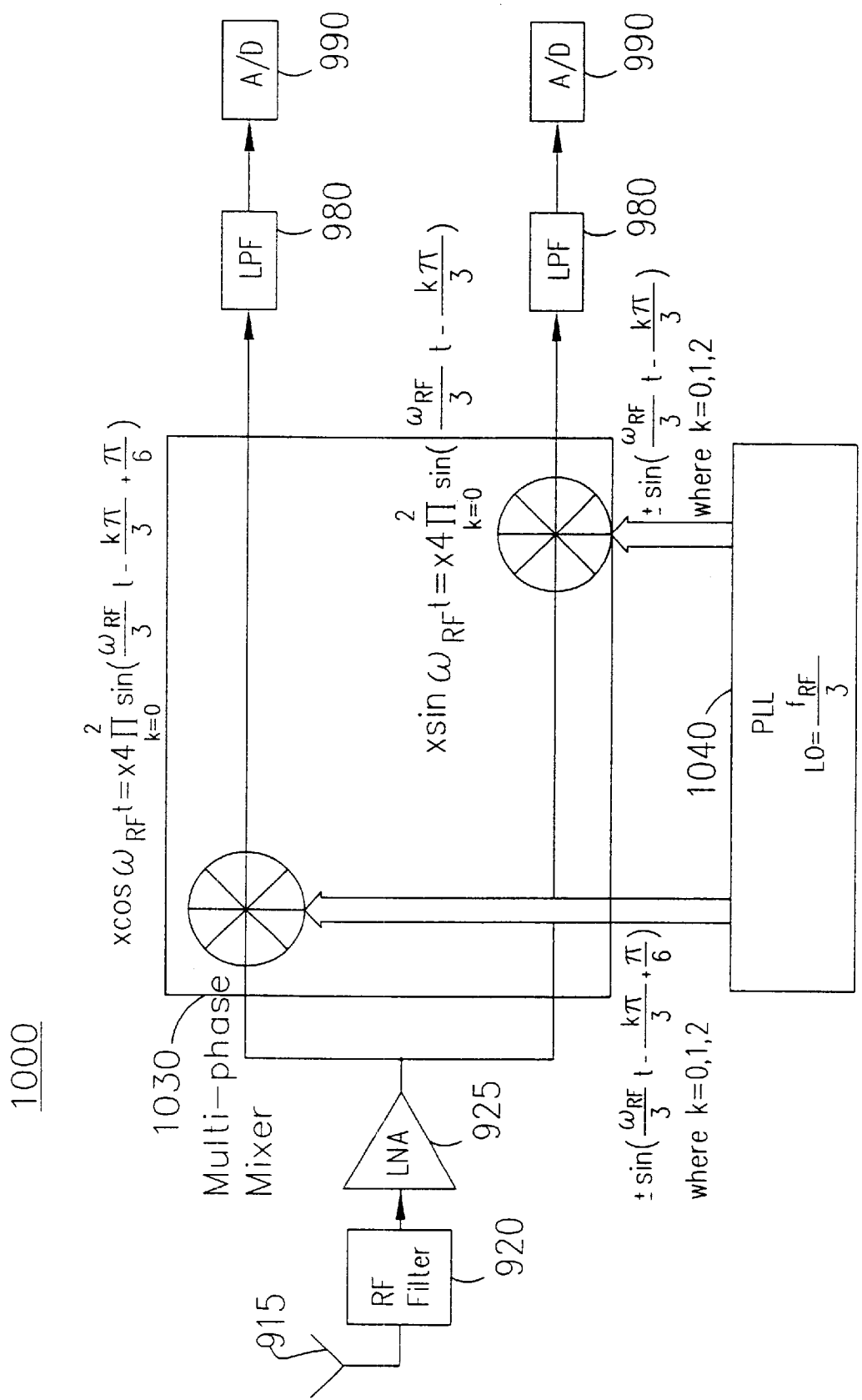
FIG. 10 is a block diagram showing the RF communication system of FIG. 9 with six phases.

FIG. 10 shows a 6-phase example of a receive portion 1000 of an MPLF conversion RF communication system that uses a multi-phase input mixer. As shown in FIG. 10, a PLL 1040 generates 12-phase sine signals, which are transmitted to a multi-phase mixer 1030. Phases (0,2,4,6,8,10) are used as inputs to an upper mixer 1032 and multiplied together with a preferably RF input, which is equivalent with multiplying cos ($\omega_{RF}t$) and the RF input. Phases (1,3,5,7,9,11) are input to a lower mixer 1034 and multiplied together with a preferably RF input, which is equivalent with multiplying sin ($\omega_{RF}t$) and the RF input.

Figure 11:
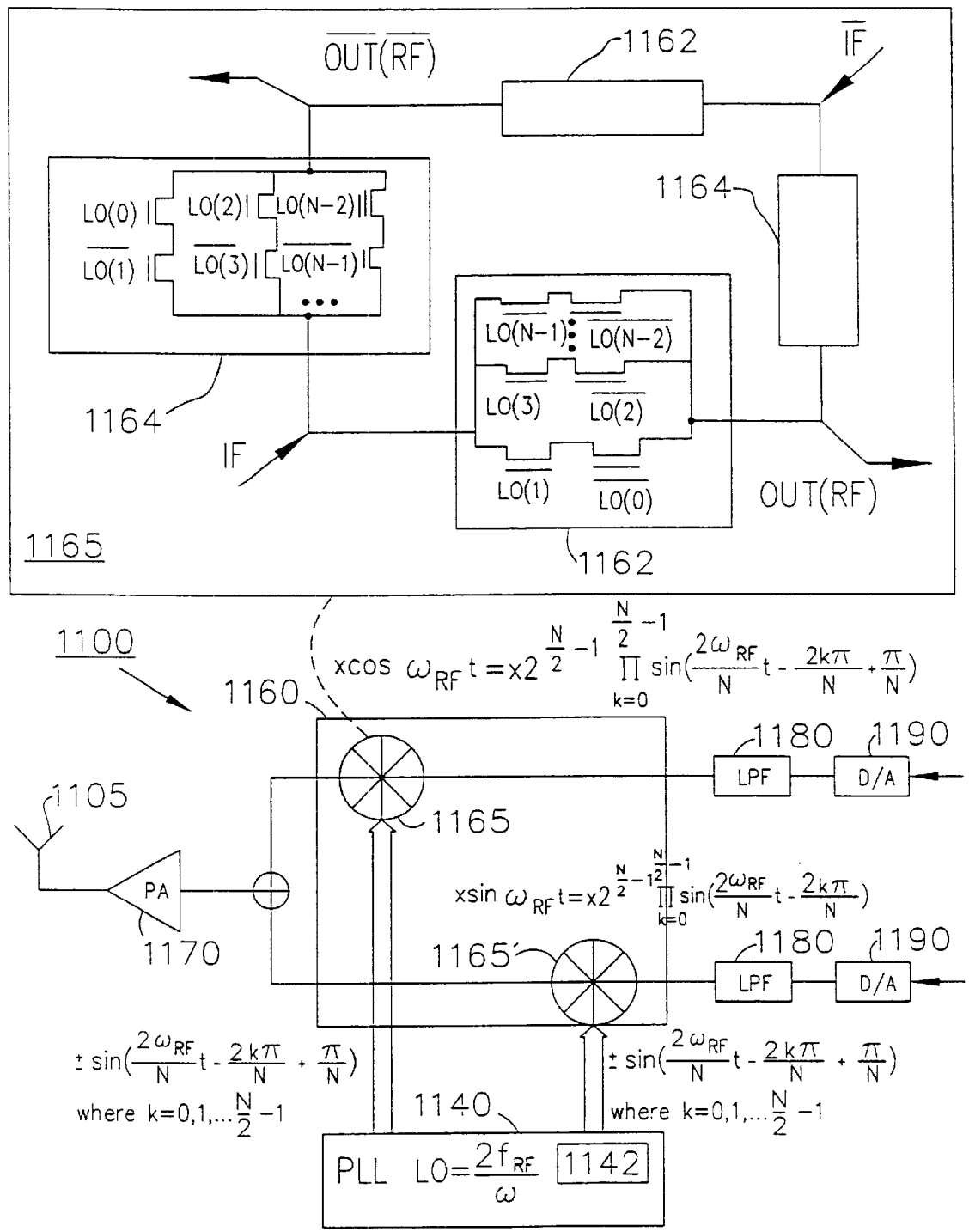
FIG. 11 is a block diagram showing a transmit portion of a RF communication to system according to still yet another preferred embodiment of the present invention.

FIG. 11 shows a MPLF conversion transmit portion 1100 of an RF block according to a fourth preferred embodiment of the present invention. The fourth preferred embodiment of the transmit portion 1100 could be used in the first preferred embodiment of the MPLF conversion RF communication system. As shown in FIG. 11, the receive portion 1100 includes an antenna 1105, mixer 1160, a PLL 1140, LPFs 1180, D/A converters 1190 and a power amplifier 1170 coupled between the mixer 1160 and the antenna 1105. The PLL 1140 generates clock signals using a clock generator 1142. The clock generator 1142 preferably generates a modulating and de-modulating clock signal using a local oscillator(LO), whose frequency is determined by a reference clock ($f_{RF}$).

In the fourth preferred embodiment of the transmit portion 1100 of an RF block, digital data is received from a DSP block (not shown) and converted into an analog signal by the D/A converter 1190 and filtered by the LPF 1180. The mixer 1160 preferably receives multi-phase low frequency (i.e., $2*f_0/N$) clock signals from the PLL 1140 and a base band signal from the LPF 1180 to generate a modulated RF signal whose frequency is $f_{RP}$. The mixer 1160 preferably includes multi-phase up conversion mixers 1165. FIG. 11 also shows a block diagram of an exemplary embodiment of the multi-phase up conversion mixer 1165. As shown in FIG. 11, the mixer 1165 uses two control circuit blocks 1162 and 1164, which receive the clock signals LO(0, . . . , N−1), /LO(0, . . . , N−1), to generate the modulated RF signal. The modulated RF data is amplified by the power amplifier 1170 and is then output by the antenna 1105.

As described above, a mixer for demodulation reduces a high frequency of RF signals received with a frequency of clock signal by multiplying the RF signals with the clock signals. In the fourth preferred embodiment, the mixer 1160 preferably modulates the transmission data to increase a low frequency of the transmission data by a frequency of the combined clock signals. Noise does not effect the transmission data as significantly on modulation relative to demodulation. However, reducing the frequency of the clock signals LO(0, . . . , N−1) does reduce or remove noise such as parasitic capacitance. In addition, the frequency limit of the CMOS technology of approximately 1 GHz can be overcome. Thus, the fourth preferred embodiment has the same advantages as the first through third preferred embodiments.

Figure 12A:
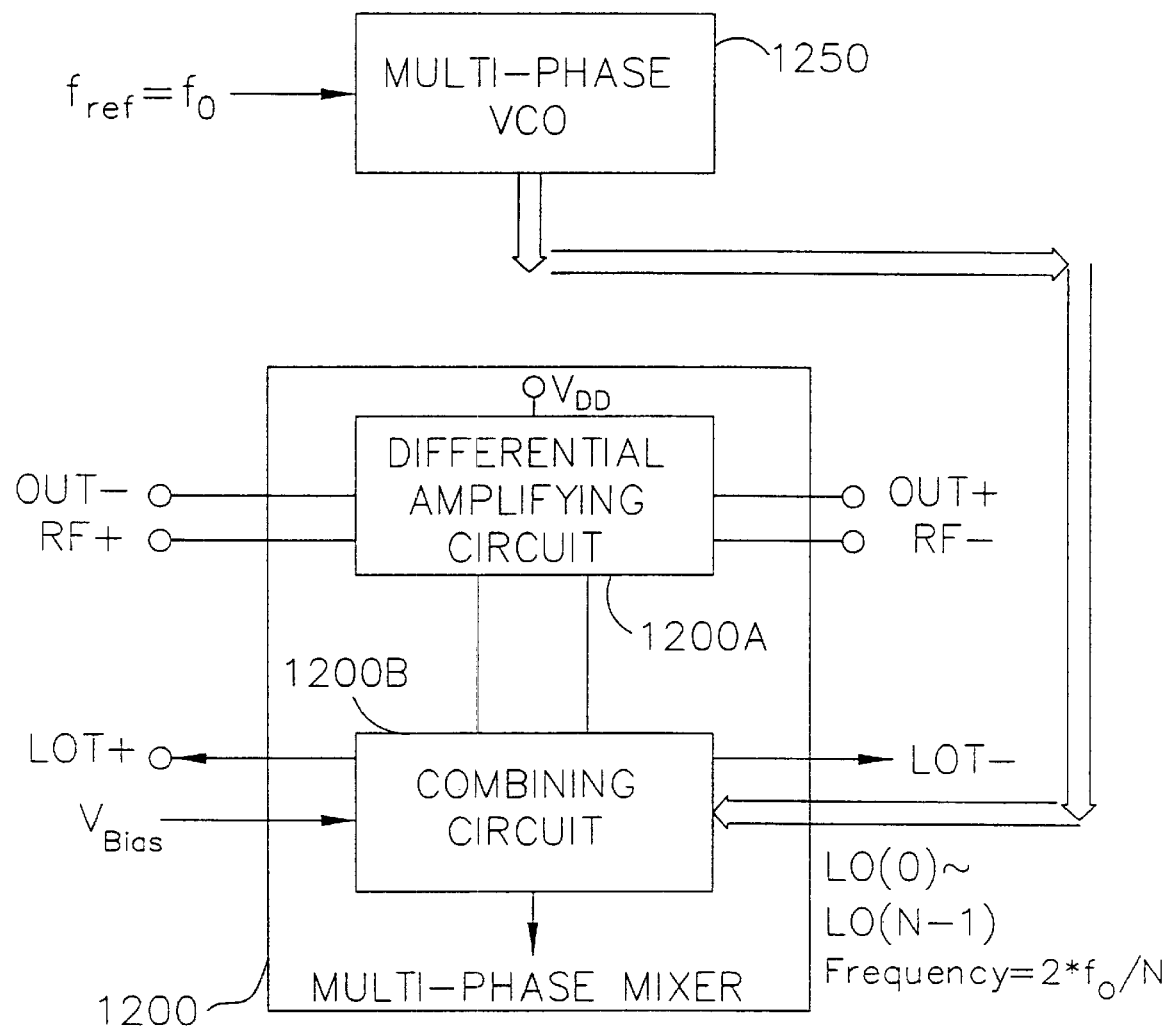
FIG. 12A is a block diagram showing an exemplary VCO-mixer structure.

FIG. 12A is a block diagram of an exemplary VCO-mixer structure in accordance with the preferred embodiments of the present invention. The VCO-mixer circuit is described in U.S. patent application Ser. No. 09/121,863, entitled "VOC-MIXER STRUCTURE" by Mr. Kyeongho Lee, the subject matter of which is hereby incorporated by reference. The structure includes a multi-phase voltage controlled oscillator VCO 1250 and a multi-phase mixer 1200. The multi-phase mixer 1200 includes a differential amplifying circuit 1200A and a combining circuit 1200B.

When a reference clock signal having a reference frequency of $f_{REF}=f_0$ is used, the multi-phase VCO 1250 generates a plurality of N-phase clock signals LO(i=0 to N−1) having a frequency of $2*f_0/N$, where $N=N_D*2$ and $N_D$ equals the number of delay cells in the multi-phase VCO 1250. In other words, the VCO 1250 reduces the frequency $f_0$ to $2*f_0/N$. The frequency $2*f_0/N$ reduces the phase noise of the multi-phase VCO and increases the frequency range.

The plurality of N-phase intermediate clock signals LO(0), LO(1), . . . ,LO(N−1) having a frequency of $2*f_0/N$ is inputted into the combining circuit 1200B of the multi-phase mixer 1200, and the input signals, for example, RF signals RF+ and RF− are inputted into the differential amplifying circuit 1200A. The differential amplifying circuit 1200B differentially amplifies the radio frequency signals RF± and RF−. The combining circuit 1200B is responsive to a bias voltage $V_{Bias}$ and combines the N-phase intermediate clock signals LO(0)−LO(N−1) to generate the output clock signals LOT+ and LOT− having the original frequency $f_0$. The mixer 1200 then accomplishes a multiplication of the output clock signals LOT+ and LOT− and the RF signals RF+ and RF−.

Figure 12B:
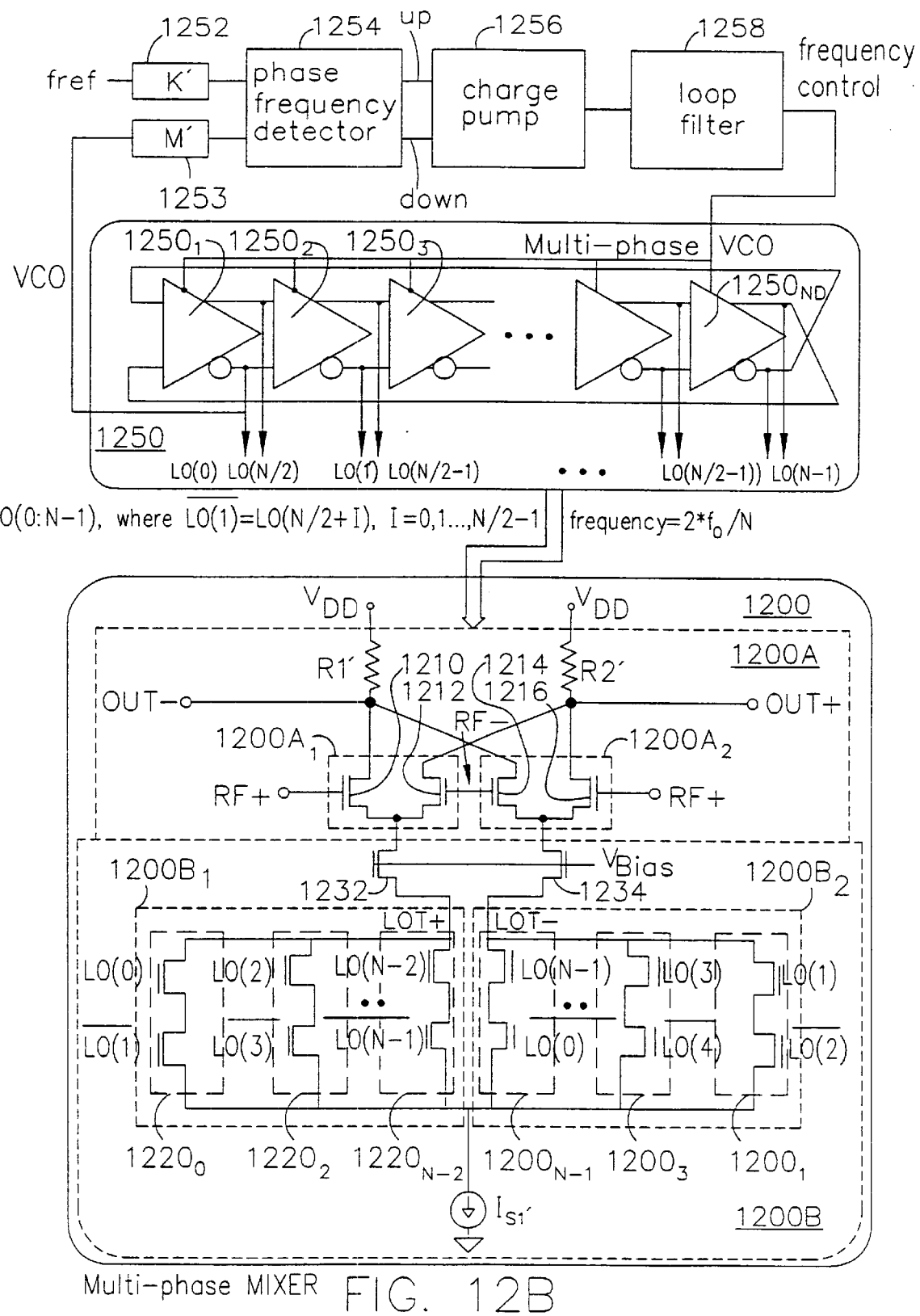
FIG. 12B is a circuit diagram showing the VCO-mixer structure of FIG. 12A.

FIG. 12B illustrates an exemplary circuit diagram of the VCO-mixer structure 1250, 1200. The multi-phase VCO 1250 includes $N_D$ number of delay cells $1250_1$–$1250_{ND}$ coupled in series. Based on such configuration, the multi-phase VCO generates a plurality of N-phase intermediate clock signals LO(0)–LO(N−1) having a frequency of $2*f_0/N$. A control circuit for the VCO 1250 that generates a frequency control signal includes a phase frequency detector 1254, a charge pump 1256 and a loop filter 1258 that outputs the frequency control signal to each of the delay cells $1250_1$–$1250_{ND}$. The phase frequency detector 1254 receives a reference clock signal $f_{ref}$ and a VCO clock signal $f_{VCO}$ from a reference clock divider circuit 1252 and a VCO clock divider circuit 1253, respectively. The frequency $2 f_0/N$ of the clock signals LO($\phi$)–LO(N−1) is represented by M'/K ($f_{ref}$)=$2f_0/N$. Thus, the frequency $f_0$ is based on the reference clock signal $f_{ref}$ and the divider circuits 1252 and 1253. In other words, $f_{VCO}$ can be $2f_0/N$ setting M'/K' of the divider circuits 1252 and 1253.

The differential amplifying circuit 1200A of the multi-phase mixer 1200 includes two load resistors R1' and R2' coupled to two differential amplifiers 1200A₁ and 1200A₂, respectively. The differential amplifier 1200A₁ includes two NMOS transistors 1210 and 1212, and the differential amplifier 1200A₂ includes two NMOS transistors 1214 and 1216. The drains of the NMOS transistor 1210 and 1216 are coupled to the load resistors R1' and R2', respectively, and the gates of the NMOS transistors 1210 and 1216 are coupled for receiving the RF signal RF+. Further, the drains of the NMOS transistors 1212 and to 1214 are coupled to the load resistors R2' and R1', respectively, and the gates are coupled for receiving the RF signal RF−. The sources of NMOS transistors 1210 and 1212 and NMOS transistors 1214 and 1216 are coupled to each other and to the combining circuit 1200B of the multi-phase mixer.

The differential amplifiers 1200A₁ and 1200A₂ differentially amplifies the RF signals RF+ and RF−, respectively, such that a more accurate output signals OUT− and OUT+ can be obtained. Further, the differential amplification removes noise that may have been added to the RF signals RF+ and RF−. In this preferred embodiment, two differential amplifiers 1200A₁ and 1200A₂ are included, however, the present invention may be also accomplished using only one of the differential amplifiers in alternative embodiments.

The combining circuit 1200B includes bias NMOS transistors 1232 and 1234, first combining unit 1200B₁ and second combining unit 1200B₂ coupled to the bias NMOS transistors 1232 and 1234, respectively, and a current source $I_{s1}$, coupled to the first and second combining units 1200B₁ and 1200B₂. The first combining unit 1200B₁ includes a plurality of transistor units 1220₀, 1220₂ ... 1220$_{N-2}$, and the second combining unit includes a second plurality of transistor units 1220₁, 1220₃ ... 1220$_{N-1}$.

Preferably, each of the plurality of transistor units includes a plurality of serially connected transistors, wherein the serially connected transistors are coupled in parallel with the serially connected transistors of the plurality of transistor units. Preferably, each transistor unit includes two (2) serially connected transistors. Hence, in the preferred embodiment, there are a total of N/2 number of transistor units in each combining unit 1200A or 1200B, such that the total number of NMOS transistors is 2*N.

The gate of the bias NMOS transistors 1232 and 1234 are coupled for receiving the bias voltage $V_{Bias}$, and the gates of the transistors in the first and second plurality of transistor units are coupled for receiving a corresponding N-phase intermediate clock signals LO(i) and /LO(i) having a frequency of $2*f_0/N$, where /LO(i)= LO(N/2+i), i=0, 1 . . . , N/2−1. In this preferred embodiment, the bias NMOS transistors 1232 and 1234 are included for prevention of error, however, such transistors may be omitted in alternative embodiments. Further, the sequential ON-OFF operation of the 2*N number NMOS transistors of the combining circuit 1200B is equivalent to a NAND logic circuit, which can be interchanged with other equivalent logic circuits and structure in alternative embodiments.

The generic FIG. 12B structure allows integration of the multi-phase VCO 1250 and multi-phase mixer 1200 on a single chip, i.e., on a single semiconductor substrate using CMOS technology. Such structure and layout reduce noise including noise caused by parasitic capacitances. As described above, the differential amplification using the RF signals RF+ and RF− in the differential amplifying circuit 1200A reduces noise.

The reduction of the reference frequency $f_0$ to N-phase intermediate clock signals LO(i) having a frequency of $2*f_0/N$ also reduces noise. When a plurality of transistors are formed on the same substrate, such as a semiconductor substrate for CMOS technology, a plurality of P-N junctions are formed in the substrate. The parasitic capacitances mostly exist at the P-N junctions. If the frequency of a signal applied to the gate of the transistor is very high, the higher frequency of $f_0$ causes much more noise compared to a reduced frequency of $2*f_0/N$.

Further, the operation of the differential amplifier circuit 1200A and the combining circuit 1200B is dependent on the output clock signals LOT+ and LOT− having a frequency of $f_0$, which are provided by the first combining unit 1200B₁ and second combining unit 1200B₂, respectively, by combining the N-phase intermediate clock signals LO(i) having a frequency of $2*f_0/N$. When the bias voltage $V_{Bias}$ is applied, the NMOS transistors 1232 and 1234 are turned ON and OFF based on the output clock signals LOT+ and LOT−. Although the NMOS transistors 1210, 1212, 1214 and 1216 are turned ON by the RF signals RF+ and RF− applied to the gate electrodes, the amplification of the RF signals RF+ and RF− and the output clock signals LOT+ and LOT− for generating the output signals OUT+ and OUT− is performed when the bias NMOS transistors 1232 and 1234 are turned on by the clock signals LOT+ and LOT−.

Figure 13:
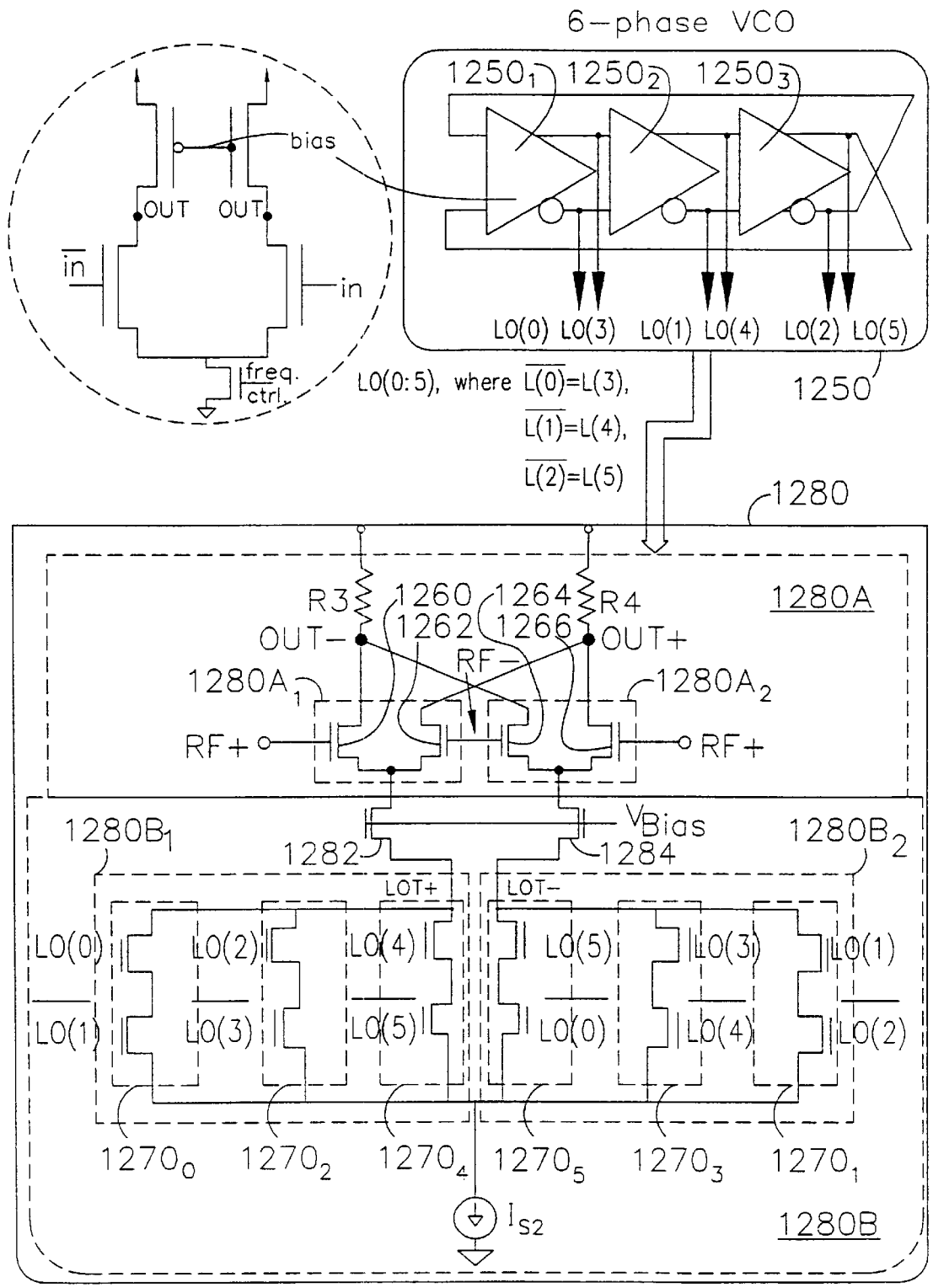
FIG. 13 is a circuit diagram showing another exemplary VCO-mixer.

FIG. 13 illustrates another exemplary embodiment of the multi-phase VCO and the multi-phase mixer when $N_D=3$ and $N=6$, and FIGS. 14A–14H illustrate the operational timing diagrams of the circuit of FIG. 13. The multi-phase VCO 1250 includes three delay cells 1250₁–1250₃ to generate 6-phase intermediate clock signals LO(0)–LO(5). An exemplary circuit including five transistors for the delay cells 1250₁–1250₃ (i.e., the delay cell 1250₁) is also shown. For illustrative purposes only, if the input clock signal has a frequency of $f_0=1.5$ GHz, the 6-phase intermediate clock signals LO(0)–LO(5) will have a frequency of 0.5 GHz.

The 6-phase mixer 1280 includes a differential amplifying circuit 1280A and a combining circuit 1280B. The differential amplifying circuit 1280A includes a first differential amplifier 1280A₁ having NMOS transistors 1260 and 1262 and a second differential amplifier 1280A₂ having NMOS transistors 1264 and 1266, which are coupled to load resistors R3 and R4, respectively. The combining circuit 1280B includes a first combining unit 1280B₁ and 1280B₂, which are commonly coupled to a current source $I_{s2}$. The first and second combining units 1280B₁ and 1280B₂ are coupled to the first and second differential amplifiers 1280₁ and 1280A₂ through bias NMOS transistors 1282 and 1284, respectively, which are biased by a bias voltage $V_{Bias}$. Cumulatively, the first and second combining units 1250B₁ and 1250B₂ includes six transistor units 1270₀–1270₅ with a total of twelve transistors.

As shown in FIGS. 14A–14F, the 6-phase VCO 1250 generates 6-phase intermediate clock signals LO(1)–LO(5) having the reduced frequency $f_0/3$. The 6-phase mixer 1250 receives the 6-phase intermediate clock signals LO(1)–LO(5) and the RF signals RF+ and RF−. Each intermediate clock signal LO(1)–LO(5) and /LO(0)–/LO(2), where /LO(0)=LO(3), /LO(1)=LO(4) and /LO(2)=LO(5), is applied to a corresponding transistor of the first and second combining units 1280B$_1$ and 1280B$_2$. The first and second combining units 1280B$_1$ and 1280B$_2$ combine the 6-phase intermediate clock signals LO(0), LO(1), . . . LO(4), LO(5) having the frequency f$_0$/3 to generate the output clock signals LOT+ and LOT− having the frequency f$_0$.

As shown in FIGS. 14A–14H, when LO(0) is high and LO(1) is low (LO(4)=high), the two output signals LOT+ and LOT− are low and high, respectively. When LO(1) is high and LO(2) is low (LO(5)=high), the output signals LOT+, LOT− are high and low, respectively. When LO(2) is high and LO(3) is low (LO(0)=high), the output signals LOT+ and LOT− are low and high, respectively. When LO (3) is high and LO(4) is low (LO(1)=high), the output signals LOT+ and LOT− are high and low, respectively. When LO(4) is high and LO(5) is low (LO(2)=high), the output signals LOT+ and LOT− of the mixer 503 are low and high, respectively. When LO(5) is high and LO(0) is low (LO(3)=high), the output signals LOT+ and LOT− are low and high, respectively.

Figure 14:
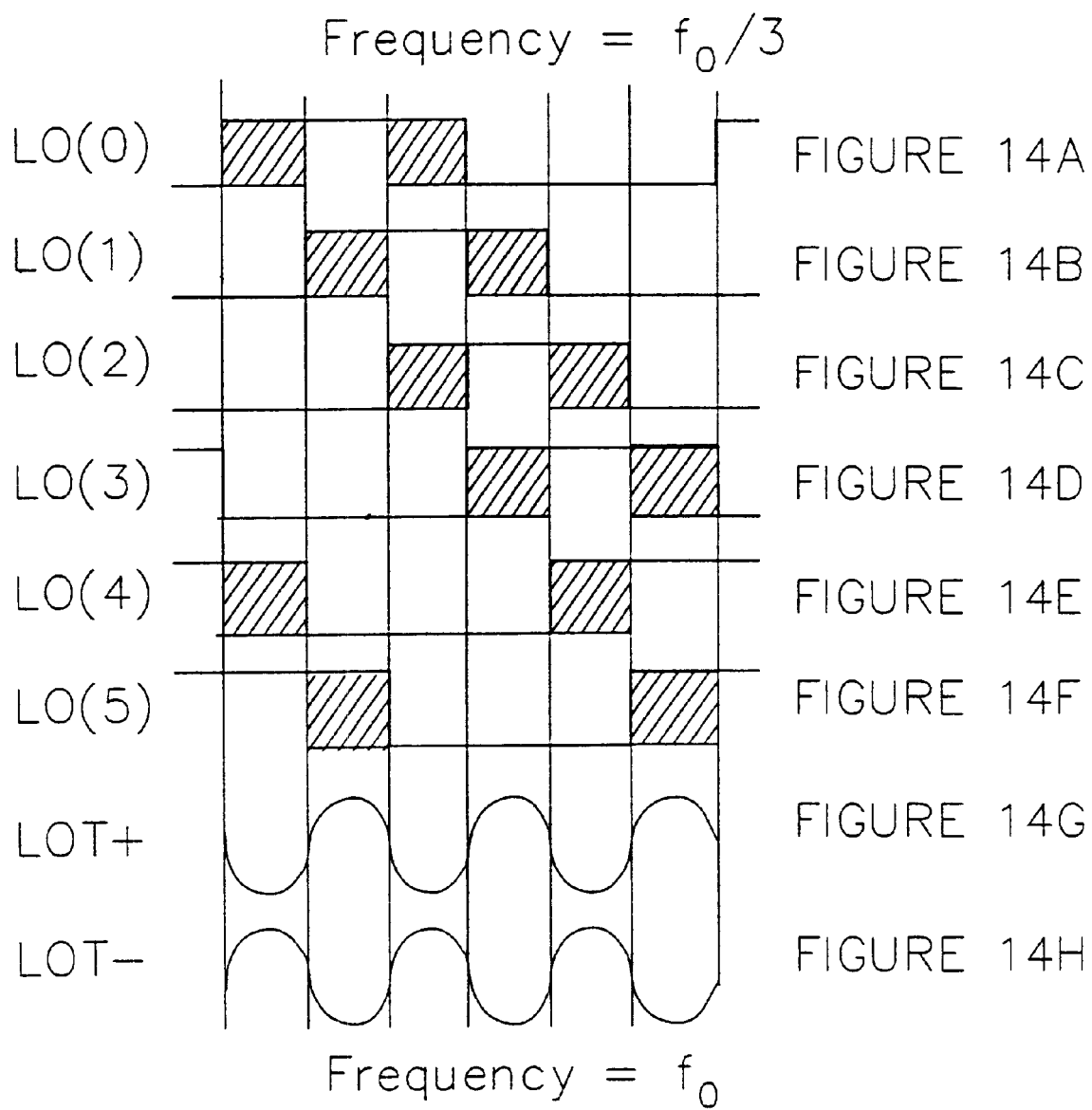
FIGS. 14A–14H are diagrams showing operational timing waveforms of FIG. 13.

Each pair of NMOS transistors in the combining circuit are turned on in order, thereby producing the output signals LOT+ and LOT−, as shown in FIGS. 14G and 14H.

As described above, the preferred embodiments of the RF communication system have various advantages. The preferred embodiment of the MPLF conversion RF communication system does not need any high quality filter and uses just one PLL. Thus, the MPLF conversion architecture can be easily integrated in one CMOS chip. Further, the frequency of channel selecting PLL is reduced from F$_{RP}$ to (2f$_{RP}$)/N, which results in the reduction of phase noise of a clock generating circuit such as a VCO and easy implementation of channel selection. In particular, the PLL frequency (LO) is different from (e.g. smaller than) the carrier frequency. As a result, the preferred embodiments of the MTLF RF communication system includes at least the advantages of both the related art direct conversion and double conversion communication systems while eliminating disadvantages of both architectures.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A communication system, comprising:
   a receiver unit that receives signals including selected signals having a carrier frequency;
   a single PLL that generates more than two multi-phase clock signals having a frequency different from the carrier frequency, wherein the multi-phase clock signals are combined to generate a plurality of local oscillator signals having a second frequency higher than the frequency; and
   a demodulation-mixer that mixes the received selected signals with the more than two multi-phase clock signals to output the selected signals having a frequency reduced by the carrier frequency, wherein each of the local oscillator signals demodulate one of an I carrier frequency signal and a Q carrier frequency signal.

2. The communication system of claim 1, wherein the frequency is smaller than the carrier frequency, and wherein the RF communication system is formed on a single CMOS chip.

3. The communication system of claim 1, wherein the PLL includes a clock generator.

4. The communication system of claim 3, wherein the clock generator is a voltage controlled oscillator.

5. The communication system of claim 1, wherein the receiver unit is a transceiver, further comprising:
   a modulation mixer that mixes the multi-phase clock signals, which operate as the local oscillator signals, with transmission data to modulate the transmission data; and
   a power amplifier that amplifies the modulated transmission data and transmits the data to the transceiver for transmission.

6. The communication system of claim 1, further comprising:
   a RF filter coupled to the receiver unit that filters the received selected signals;
   a low noise amplifier coupled to the RF filter that amplifies the filtered selected signals with a gain; and
   a low pass filter coupled to the demodulation mixer that filters the selected signals having the frequency reduced by the carrier frequency.

7. The communication system as claimed in claim 1, further comprising:
   an A/D converting unit that converts the selected signals from the demodulation-mixer into digital signals; and
   a discrete-time signal processing unit that receives the digital signals.

8. The communication system of claim 1, wherein the communication system is a RF receiver portion, wherein the selected signals are RF signals, wherein the multi-phase clock signals have a frequency of (2*carrier frequency/N) where N is a positive integer greater than two, and wherein the RF communication system is formed on a single CMOS chip.

9. The communication system of claim 1, wherein the RF communication system is operated with the carrier frequency greater than 1 GHz.

10. A single chip RF communication system, comprising:
    a transceiver for receiving and transmitting RF signals;
    a single PLL for generating a plurality of 2N-phase clock signals having a substantially identical frequency 2*f$_0$/N smaller than a carrier frequency f$_o$, wherein N is a positive integer as a phase number;
    a demodulation mixing unit for mixing the RF signals from the transceiver with the plurality of 2N-phase clock signals from the PLL to output the RU signals having a frequency reduced by the carrier frequency, wherein the demodulation mixer comprises a plurality of two input mixers, wherein the plurality of 2N-phase clock signals are combined to demodulate at least one of an I carrier frequency signal and a Q carrier frequency signal; and
    an A/D converting unit for converting the RF signals from the demodulation mixing unit into digital signals.

11. The single chip RF communication system of claim 10, wherein the demodulation mixing unit includes a first mixer array comprising one half of the two input mixers and a second mixer array comprising the other half of the two input mixers, and each mixer array inputs each corresponding N-phase clock signals of the 2N-phase clock signals together with the RF signals.

12. The single chip RF communication system of claim 10, wherein each mixer array comprises multi-stages of mixers, each stage includes at least one two-input mixer, and a first stage of the multi-stages inputs the RF signals and N-phase clock signals.

13. The single chip RF communication system of claim 12, wherein the multi-stages have a corresponding reducing number of mixers K1>K2>K3> . . . >Ki, where K1 is the first stage, K2 is a second stage, K3 is a third stage, and Ki is a with stage.

14. A method of operating a RF communication system, comprising:
receiving signals including selected signals having a carrier frequency;
generating more than two multi-phase clock signals each having a substantially identical frequency different from the carrier frequency, wherein the multi-phase clock signals are combined to generate a plurality of local oscillator signals having a second frequency higher than the frequency; and
mixing the received carrier frequency selected signals with the more than two multi-phase clock signals to output demodulated selected signals having a frequency reduced from the carrier frequency so that corresponding ones of the local oscillator signals combined from the more than two multi-phase clock signals demodulate one of a first carrier frequency signal and a second carrier frequency signal.

15. The method of claim 14, wherein the frequency is smaller than the carrier frequency, wherein the generating step uses a PLL that includes a voltage controlled oscillator, and wherein the first carrier frequency signal is an I carrier frequency signal and the second carrier frequency signal is a Q carrier frequency signal.

16. The method of claim 14, further comprising:
RF filtering the received selected signals;
amplifying the filtered selected signals with a gain; and
low pass filtering the demodulated selected signals having the frequency reduced to baseband;
A/D converting the low pass filtered frequency reduced selected signals into digital signals; and
discrete-time signal processing the digital signals.

17. The method of claim 14, further comprising:
modulation mixing the multi-phase clock signals combined as the local oscillator signals with transmission data to modulate the transmission data; and
power amplifying the modulated transmission data and transmitting the data to the transceiver for transmission.

18. The communication system of claim 1, wherein the demodulation mixer comprises a first mixer array and a second mixer array, each of the first and second mixer arrays including a plurality of multiple input mixers.

19. The communication system of claim 1, wherein the demodulation mixer comprises a first mixer array and a second mixer array, each of the first and second mixer arrays having a plurality of mixer stages, each of the mixer stages having at least one multiple input mixer.

20. The communication system of claim 19, wherein output signals from the at least one multiple input mixer of a first of the plurality of stages are input into at least one multiple input mixer of a second of the plurality of stages.

21. The communication system of claim 1, wherein the more than two multi-phase clock signals comprise a plurality of pairs of multi-phase clock signals, each of the plurality of pairs including an I carrier frequency signal and a Q carrier frequency signal.

22. The communication system of claim 1, wherein a reference signal is formed by combining the more than two multi-phase clock signals.

23. The single chip RF communication system of claim 10, wherein the demodulation mixing unit comprises a first mixer array and a second mixer array, each of the first and second mixer arrays including a plurality of multiple input mixers.

24. The single chip RF communication system of claim 10, wherein the demodulation mixing unit comprises a first mixer array and a second mixer array, each of the first and second mixer arrays having a plurality of mixer stages, each of the mixer stages having at least one multiple input mixer.

25. The single chip RF communication system of claim 24, wherein output signals from the at least one multiple input mixer of a first of the plurality of stages are input into at least one multiple input mixer of a second of the plurality of stages.

26. The single chip RF communication system of claim 10, wherein local oscillator signals are formed by combining the plurality of 2N-phase clock signals.

27. The single chip RF communication system of claim 10, wherein the plurality of 2N-phase clock signals are divided into a first plurality of clock signals combined to form an I carrier frequency, and a second plurality of clock signals combined to form a Q carrier frequency.

28. The method of claim 14, further comprising combining the more than two multi-phase clock signals to form a reference signal.

29. The method of claim 14, wherein the RF communication system is formed using CMOS technology and operates with the carrier frequency greater than 1 GHz.

30. The single chip RF communication system of claim 10, wherein the RF communication system is formed using CMOS technology and operates with the carrier frequency greater than 1 GHz.

31. A communication system, comprising:
receiving means for receiving signals including selected signals having a carrier frequency;
single PLL means for generating more than two multi-phase clock signals having a first frequency smaller than the carrier frequency; and
demodulation-mixer means for combining the multi-phase clock signals to form a plurality of local oscillator signals that each have a second frequency higher than the first frequency and for mixing with the received selected signals to output the selected signals having a frequency reduced from the carrier frequency, wherein the local oscillator signals demodulate corresponding ones of an I carrier frequency signal and a Q carrier frequency signal.

32. A single chip RF communication system, comprising:
transceiver means for receiving and transmitting RF signals;
single PLL means for generating a plurality of 2N-phase clock signals having a substantially identical frequency $2*f_o/N$ smaller than a carrier frequency $f_o$, wherein N is a positive integer as a phase number; and
demodulation mixing means for mixing the RF signals from the transceiver means with the plurality of 2N-phase clock signals from the PLL means to output the RF signals having a frequency reduced by the carrier frequency, wherein the demodulation mixer means comprises a first plurality of two input mixer means and a second plurality of two input mixer means, wherein the plurality of 2N-phase clock signals are combined to demodulate at least one of an I carrier frequency signal and a Q carrier frequency signal.

* * * * *